United States Patent
Xuan et al.

(10) Patent No.: US 9,035,439 B2
(45) Date of Patent: *May 19, 2015

(54) APPARATUS, SYSTEM AND METHOD FOR USE IN MOUNTING ELECTRONIC ELEMENTS

(75) Inventors: Wong Xuan, Huizhou (CN); Xie Jian Hui, Huizhou (CN); Cheng Siu Cheong, Hong Kong (CN)

(73) Assignee: Cree Huizhou Solid State Lighting Company Limited, Huizhou, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/695,978

(22) Filed: Jan. 28, 2010

(65) Prior Publication Data

US 2010/0133002 A1 Jun. 3, 2010

Related U.S. Application Data

(62) Division of application No. 11/277,717, filed on Mar. 28, 2006, now Pat. No. 7,675,145.

(51) Int. Cl.
| | |
|---|---|
| *H01L 33/62* | (2010.01) |
| *H01L 33/38* | (2010.01) |
| *H01L 23/495* | (2006.01) |
| *H05K 5/00* | (2006.01) |
| *H01L 33/48* | (2010.01) |

(52) U.S. Cl.
CPC ............ *H05K 5/0091* (2013.01); *H01L 33/486* (2013.01); *H01L 33/62* (2013.01); *H01L 2224/48091* (2013.01); *H01L 2224/48247* (2013.01); *H01L 2924/1815* (2013.01)

(58) Field of Classification Search
CPC ..................................................... H01L 33/486
USPC ............ 438/116, 121, 123, 26; 257/676, 692, 257/E33.057, E33.066; 250/214.1, 239; 174/536
See application file for complete search history.

(56) References Cited

U.S. PATENT DOCUMENTS

| | | | |
|---|---|---|---|
| 3,760,237 A | 9/1973 | Jaffe | ............................... 257/98 |
| 4,307,297 A | 12/1981 | Groff | |

(Continued)

FOREIGN PATENT DOCUMENTS

| | | |
|---|---|---|
| CN | 1274906 A | 11/2000 |
| CN | 2498694 | 7/2002 |

(Continued)

OTHER PUBLICATIONS

Japanese Patent Application 2001-60072, dated: Mar. 6, 2001.

(Continued)

*Primary Examiner* — Mary Wilczewski
(74) *Attorney, Agent, or Firm* — Koppel, Patrick, Heybl & Philpott

(57) ABSTRACT

The present embodiments provide surface mount devices and/or systems. In some embodiments, the surface mount devices comprise a casing having a recess formed extending at least partially into said casing; and first and second leads each of which is at least partially encased by said casing and each of which has a portion exposed through said recess, wherein at least one of said first and second leads has one or more size reduction features in its said exposed portion that reduces the surface area to provide an increased surface bonding area to said casing around said lead.

32 Claims, 5 Drawing Sheets

(56) References Cited

U.S. PATENT DOCUMENTS

| | | | |
|---|---|---|---|
| 4,322,735 A | 3/1982 | Sadamasa | |
| 4,511,425 A | 4/1985 | Boyd | 156/493 |
| 5,040,868 A | 8/1991 | Waitl | |
| 5,042,048 A | 8/1991 | Meyer | 372/108 |
| 5,122,943 A | 6/1992 | Pugh | 362/256 |
| 5,130,761 A | 7/1992 | Tanaka | 357/17 |
| 5,167,556 A | 12/1992 | Stein | |
| 5,351,106 A | 9/1994 | Lesko | 355/83 |
| 5,703,401 A | 12/1997 | Van de Water | |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,942,770 A | 8/1999 | Ishinaga et al. | 257/89 |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | 361/777 |
| 6,274,924 B1 | 8/2001 | Carey et al. | 257/676 |
| 6,296,367 B1 | 10/2001 | Parsons et al. | 362/183 |
| 6,359,236 B1 | 3/2002 | DiStefano et al. | 374/261 |
| 6,376,902 B1 | 4/2002 | Arndt | |
| 6,447,124 B1 | 9/2002 | Fletcher et al. | 359/604 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima et al. | 362/231 |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. | 313/496 |
| 6,624,491 B2 | 9/2003 | Waitl et al. | |
| 6,680,490 B2 | 1/2004 | Yasukawa et al. | |
| 6,686,609 B1 | 2/2004 | Sung | |
| 6,700,136 B2 | 3/2004 | Guida | 257/79 |
| 6,707,069 B2 | 3/2004 | Song et al. | 257/79 |
| 6,710,373 B2 | 3/2004 | Wang | 257/79 |
| 6,717,353 B1 | 4/2004 | Mueller et al. | 313/501 |
| 6,759,733 B2 | 7/2004 | Arndt | 257/672 |
| 6,765,235 B2 | 7/2004 | Taninaka et al. | 257/88 |
| 6,770,498 B2 | 8/2004 | Hsu | 438/26 |
| 6,774,401 B2 | 8/2004 | Nakada et al. | |
| 6,791,259 B1 | 9/2004 | Stokes | |
| 6,858,879 B2 | 2/2005 | Waitl et al. | 257/99 |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,919,586 B2 | 7/2005 | Fujii | |
| 6,940,704 B2 | 9/2005 | Stalions | |
| 6,946,714 B2 | 9/2005 | Waitl | |
| 6,964,877 B2 | 11/2005 | Chen et al. | 438/20 |
| 6,975,011 B2 | 12/2005 | Arndt | |
| 6,995,510 B2 | 2/2006 | Murakami et al. | |
| D517,025 S | 3/2006 | Asakawa | D13/180 |
| 7,009,285 B2* | 3/2006 | Su et al. | 257/680 |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | 362/257 |
| 7,102,213 B2 | 9/2006 | Sorg | |
| 7,102,215 B2* | 9/2006 | Arndt | 257/672 |
| 7,119,422 B2 | 10/2006 | Chin | 257/666 |
| 7,161,189 B2 | 1/2007 | Wu | 57/98 |
| 7,183,632 B2* | 2/2007 | Arndt | 257/672 |
| 7,187,009 B2 | 3/2007 | Fukasawa et al. | 257/99 |
| 7,224,000 B2 | 5/2007 | Aanegola et al. | 257/98 |
| 7,244,965 B2 | 7/2007 | Andrews et al. | |
| 7,271,425 B2* | 9/2007 | Arndt et al. | 257/99 |
| 7,282,740 B2* | 10/2007 | Chikugawa et al. | 257/79 |
| 7,282,785 B2* | 10/2007 | Yoshida | 257/666 |
| 7,285,802 B2 | 10/2007 | Ouderkirk et al. | 257/98 |
| 7,303,315 B2 | 12/2007 | Ouderkirk et al. | 362/294 |
| 7,317,181 B2* | 1/2008 | Murakami et al. | 250/214.1 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 | 9/2008 | Oyama et al. | 257/675 |
| 7,436,002 B2* | 10/2008 | Brunner et al. | 257/99 |
| 7,579,628 B2 | 8/2009 | Inoguchi | 257/81 |
| 7,622,795 B2 | 11/2009 | Chiang | 257/675 |
| 7,635,915 B2 | 12/2009 | Xie et al. | 257/692 |
| 7,692,206 B2 | 4/2010 | Loh | 257/99 |
| 7,777,412 B2 | 8/2010 | Pang | 313/506 |
| 7,875,899 B2 | 1/2011 | Yasuda | 257/99 |
| 7,923,831 B2 | 4/2011 | Ng | 257/692 |
| 8,217,414 B2 | 7/2012 | Hayashi | 257/99 |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0130405 A1* | 9/2002 | Kobayashi et al. | 257/687 |
| 2002/0163001 A1 | 11/2002 | Shaddock | |
| 2002/0195935 A1 | 12/2002 | Jager | |
| 2003/0116769 A1 | 6/2003 | Song et al. | |
| 2003/0160256 A1 | 8/2003 | Durocher et al. | 257/88 |
| 2003/0183852 A1 | 10/2003 | Takenaka | |
| 2004/0016938 A1 | 1/2004 | Baretz et al. | 257/100 |
| 2004/0037076 A1 | 2/2004 | Katoh et al. | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0090174 A1 | 5/2004 | Tasch et al. | |
| 2004/0126913 A1 | 7/2004 | Loh | |
| 2004/0201028 A1 | 10/2004 | Waitl | |
| 2004/0217364 A1 | 11/2004 | Tarsa | |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0256706 A1 | 12/2004 | Nakashima | |
| 2005/0023548 A1 | 2/2005 | Bhat | |
| 2005/0072981 A1 | 4/2005 | Suenaga | 257/88 |
| 2005/0077535 A1 | 4/2005 | Li | |
| 2005/0082574 A1 | 4/2005 | Tasch et al. | |
| 2005/0093005 A1 | 5/2005 | Ruhnau | |
| 2005/0110033 A1 | 5/2005 | Heremans et al. | 257/98 |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa | |
| 2005/0179041 A1 | 8/2005 | Harbers et al. | |
| 2005/0179376 A1 | 8/2005 | Fung et al. | |
| 2005/0199899 A1 | 9/2005 | Lin et al. | 257/99 |
| 2005/0231983 A1 | 10/2005 | Dahm | |
| 2005/0253130 A1 | 11/2005 | Tsutsumi et al. | 257/13 |
| 2006/0022212 A1 | 2/2006 | Waitl | |
| 2006/0049477 A1 | 3/2006 | Arndt et al. | |
| 2006/0054912 A1 | 3/2006 | Murakami et al. | |
| 2006/0060867 A1 | 3/2006 | Suehirom | 257/81 |
| 2006/0091406 A1 | 5/2006 | Kaneko et al. | 257/81 |
| 2006/0105478 A1 | 5/2006 | Camras et al. | |
| 2006/0108594 A1 | 5/2006 | Iwasaki et al. | |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0220046 A1 | 10/2006 | Yu et al. | |
| 2006/0267031 A1 | 11/2006 | Tasch et al. | |
| 2006/0267042 A1 | 11/2006 | Izuno et al. | 257/100 |
| 2006/0278882 A1 | 12/2006 | Leung et al. | 257/98 |
| 2006/0291185 A1 | 12/2006 | Atsushi | 362/29 |
| 2007/0046176 A1 | 3/2007 | Bukesov et al. | |
| 2007/0096139 A1 | 5/2007 | Schultz | |
| 2007/0109779 A1 | 5/2007 | Sekiguchi et al. | |
| 2007/0145401 A1 | 6/2007 | Ikehara | |
| 2007/0170449 A1 | 7/2007 | Anandan | |
| 2007/0241357 A1 | 10/2007 | Yan | 257/98 |
| 2007/0252250 A1 | 11/2007 | Hui | |
| 2007/0262328 A1 | 11/2007 | Bando | |

(56) References Cited

U.S. PATENT DOCUMENTS

| | | |
|---|---|---|
| 2007/0269586 A1 | 11/2007 | Leatherdale |
| 2007/0294975 A1 | 12/2007 | Nadar et al. ............. 52/483 |
| 2007/0295975 A1 | 12/2007 | Omae ............................ 257/89 |
| 2008/0013319 A1 | 1/2008 | Pei et al. |
| 2008/0026498 A1 | 1/2008 | Tarsa et al. ...................... 438/26 |
| 2008/0074032 A1 | 3/2008 | Yano et al. ..................... 313/503 |
| 2008/0093606 A1 | 4/2008 | Pan et al. |
| 2008/0121921 A1 | 5/2008 | Loh et al. |
| 2008/0149960 A1 | 6/2008 | Amo et al. ...................... 257/98 |
| 2008/0170391 A1 | 7/2008 | Norfidathul et al. .......... 362/227 |
| 2008/0186702 A1 | 8/2008 | Camras et al. |
| 2008/0191232 A1 | 8/2008 | Lee et al. |
| 2008/0198594 A1 | 8/2008 | Lee |
| 2008/0230790 A1 | 9/2008 | Seko et al. |
| 2008/0258156 A1 | 10/2008 | Hata ............................... 257/88 |
| 2008/0296590 A1 | 12/2008 | Ng ................................. 257/68 |
| 2008/0303052 A1 | 12/2008 | Lee et al. |
| 2008/0308825 A1 | 12/2008 | Chakraborty |
| 2009/0050908 A1 | 2/2009 | Yuan et al. |
| 2009/0050911 A1 | 2/2009 | Chakraborty |
| 2009/0057699 A1 | 3/2009 | Basin |
| 2009/0057708 A1 | 3/2009 | Abdul Karim et al. ....... 257/100 |
| 2009/0072251 A1 | 3/2009 | Chan et al. ..................... 257/89 |
| 2009/0095966 A1 | 4/2009 | Keller et al. .................... 257/98 |
| 2009/0129085 A1 | 5/2009 | Aizar et al. ................... 362/247 |
| 2009/0189178 A1 | 7/2009 | Kim et al. |
| 2009/0283781 A1 | 11/2009 | Chan et al. |
| 2010/0044735 A1 | 2/2010 | Oyamada |
| 2010/0103660 A1 | 4/2010 | Van de Ven et al. .......... 362/231 |
| 2010/0193822 A1 | 8/2010 | Inobe et al. ..................... 257/98 |
| 2011/0049545 A1 | 3/2011 | Basin et al. ..................... 257/98 |
| 2011/0108874 A1 | 5/2011 | Chu et al. |
| 2011/0121345 A1 | 5/2011 | Andrews et al. |
| 2011/0186880 A1 | 8/2011 | Kohler et al. ................... 257/91 |
| 2011/0193118 A1 | 8/2011 | Oshima et al. |
| 2011/0278617 A1 | 11/2011 | Lee |
| 2012/0235199 A1 | 9/2012 | Andrews et al. |
| 2012/0257386 A1 | 10/2012 | Harbers et al. ................ 362/235 |

FOREIGN PATENT DOCUMENTS

| | | |
|---|---|---|
| CN | 2549313 | 5/2003 |
| CN | 2617039 Y | 5/2004 |
| CN | 2646873 | 10/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1874011 A | 12/2006 |
| CN | 1913135 A | 2/2007 |
| CN | 1977399 A | 6/2007 |
| CN | 101005109 A | 7/2007 |
| CN | 101013689 | 8/2007 |
| CN | 101360368 | 2/2009 |
| DE | WO9931737 | 6/1999 |
| DE | WO2004027882 | 4/2004 |
| DE | 202007012162 | 4/2008 |
| EP | 0684648 | 11/1995 |
| EP | 1005085 A2 | 5/2000 |
| EP | 1005085 A3 | 12/2000 |
| EP | 1187226 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1653254 A2 | 5/2006 |
| EP | 1693904 | 8/2006 |
| EP | 1864780 | 12/2007 |
| EP | 1 953 834 A1 | 8/2008 |
| GB | 2420221 A | 12/2004 |
| GB | 2420221 A | 5/2006 |
| GB | 2 458 972 A | 10/2009 |
| GB | 2466633 A | 7/2010 |
| JP | 53-118019 | 10/1978 |
| JP | S53118019 | 10/1978 |
| JP | S53126570 | 10/1978 |
| JP | 59-027559 A | 2/1984 |
| JP | 59027559 | 2/1984 |
| JP | 61-048951 A | 3/1986 |
| JP | 6148951 | 3/1986 |
| JP | 61048951 | 3/1986 |
| JP | S62160564 | 3/1986 |
| JP | 62097156 | 2/1987 |
| JP | 62140758 | 9/1987 |
| JP | 038459 | 1/1991 |
| JP | 03-171780 | 7/1991 |
| JP | 06-177424 | 6/1994 |
| JP | 7-202271 A | 8/1995 |
| JP | 07202271 | 8/1995 |
| JP | 08032120 | 2/1996 |
| JP | 61048951 | 3/1996 |
| JP | 8139257 | 5/1996 |
| JP | 10135453 | 5/1998 |
| JP | 10321909 | 12/1998 |
| JP | 11008405 | 1/1999 |
| JP | 11-054802 | 2/1999 |
| JP | 11150306 | 6/1999 |
| JP | 11261113 | 9/1999 |
| JP | 2000-188358 | 7/2000 |
| JP | 2000-223751 | 8/2000 |
| JP | 2000261041 | 9/2000 |
| JP | 2001044506 | 2/2001 |
| JP | 2001-168400 | 6/2001 |
| JP | 2001237463 | 8/2001 |
| JP | 2001518692 | 10/2001 |
| JP | 2002009217 | 1/2002 |
| JP | 2002-223005 | 8/2002 |
| JP | 2002374005 | 12/2002 |
| JP | 2003-197974 | 7/2003 |
| JP | 2003-264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004-111937 A | 4/2004 |
| JP | 2004146815 | 5/2004 |
| JP | 2004-200236 | 7/2004 |
| JP | 2004228387 | 8/2004 |
| JP | 2004327955 | 11/2004 |
| JP | 2004335740 | 11/2004 |
| JP | 2004335880 | 11/2004 |
| JP | 2004342870 | 12/2004 |
| JP | 2005-919838 A | 1/2005 |
| JP | 2005019838 | 1/2005 |
| JP | 2005-079167 | 3/2005 |
| JP | 2005150624 | 6/2005 |
| JP | 2005223222 | 8/2005 |
| JP | 2005259754 | 9/2005 |
| JP | 2005259972 | 9/2005 |
| JP | 2005-310935 | 11/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006-119357 | 5/2006 |
| JP | 2006179520 | 7/2006 |
| JP | 2006253689 | 9/2006 |
| JP | 2006-324331 | 11/2006 |
| JP | 2006332234 | 12/2006 |
| JP | 2006344692 | 12/2006 |
| JP | 2007-094088 | 4/2007 |
| JP | 2007109836 | 4/2007 |
| JP | 2007509505 | 4/2007 |
| JP | 2007-165029 | 6/2007 |
| JP | 2007165840 | 6/2007 |
| JP | 2007184542 | 7/2007 |
| JP | 2007243226 | 9/2007 |

(56) References Cited

FOREIGN PATENT DOCUMENTS

| | | |
|---|---|---|
| JP | 2007-273763 | 10/2007 |
| JP | 2007273763 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008518461 | 5/2008 |
| JP | 2008521236 | 6/2008 |
| JP | 2000223752 | 8/2008 |
| RU | 2251761 | 2/2005 |
| WO | WO 0217405 | 2/2002 |
| WO | WO 03049204 | 6/2003 |
| WO | WO 2004003660 | 4/2004 |
| WO | WO 2004036660 | 4/2004 |
| WO | WO 2004044877 | 5/2004 |
| WO | WO 2004/053933 A2 | 6/2004 |
| WO | WO 2005043627 A1 | 5/2005 |
| WO | WO 2005104247 | 11/2005 |
| WO | WO 2006016398 | 2/2006 |
| WO | WO 2006046981 | 5/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2006135502 | 12/2006 |
| WO | WO 2007/083408 A1 | 7/2007 |
| WO | WO 2007121486 A2 | 10/2007 |
| WO | WO2007/127029 A2 | 11/2007 |
| WO | WO 2007122516 | 11/2007 |
| WO | WO 2008081794 A1 | 7/2008 |
| WO | WO 2008082098 | 7/2008 |
| WO | WO 2009/074919 A1 | 6/2009 |
| WO | WO 2010005294 | 1/2010 |
| WO | WO 2012099445 A1 | 7/2012 |

OTHER PUBLICATIONS

Related Office Action from U.S. Appl. No. 11/277,717, dated: Jan. 6, 2009.
Related Office Action from related U.S. Appl. No. 11/277,717, dated Jul. 27, 2009.
PCT International Search Report for related PCT Application No. PCT/IB2007/002432, Dated: Jan. 11, 2008.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-009-002857, dated: Jul. 24, 2009.
Related PCT International Search Report and Written Opinion, PCT/IB2007/002411, Date: Jan. 10, 2008.
U.S. Appl. No. 11/380,402, filed Apr. 26, 2006, Jian Hui Xie.
Preliminary Notice of Reasons for Refusal re related Japanese Application No. 2009-002857, dated: Apr. 24, 2009, pp. 1-2.
Office Action from U.S. Appl. No. 11/277,717, dated Sep. 23, 2008.
Response to Office Action from U.S. Appl. No. 11/277,717, filed on Oct. 23, 2008.
Office Action from U.S. Appl. No. 11/277,717, dated: Jan. 6, 2009.
Response to Office Action from U.S. Appl. No. 11/277,717, dated: Apr. 24, 2009.
Office Action from U.S. Appl. No. 11/277,717, dated: Jul. 27, 2009.
Response to Office Action from U.S. Appl. No. 11/277,717, dated: Oct. 6, 2009.
Notice of Allowance from U.S. Appl. No. 11/277,717, dated: Oct. 21, 2009.
Declaration of Gerald Kegley under 37 C.F.R.§ 1.132, dated: Aug. 20, 2009.
Declaration of Charles Swoboda under 37 C.P.A.§ 1.132, dated: Aug. 19, 2009.
(From Related Chinese Application): Chinese Application No. 200710142310.7 dated Dec. 11, 2009.
(From Related Application: International Search Report for PCT/CN2009/074800 mailed Feb. 25, 2010.
Office Action from U.S. Appl. No. 11/149.998. dated: Nov. 20, 2009.
Response to Office Action from U.S. Appl. No. 11/149.998, dated: Feb. 22, 2010.
Office Action from U.S. Appl. No. 12/154.691. dated: Dec. 17, 2009.
Response to Office Action from U.S. Appl. No. 12/154.691, dated: May 17, 2010.
Office Action from U.S. Appl. No. 11/465.120. dated: Mar. 9, 2010.
Office Action from U.S. Appl. No. 12/152.766. dated: Mar. 12, 2010.
Office Action from U.S. Appl. No. 12/069.827. dated: Apr. 20, 2010.
Office Action from U.S. Appl. No. 12/321.059. dated: May 17, 2010.
Office Action from U.S. Appl. No. 11/149.998. dated: May 18, 2010.
First Office Action for counterpart Chinese Patent Application No. 200780019643.9 dated Mar. 29, 2010.
Appeal Decision in Japanese Design Patent Application No. 2009-002857 (Appeal No. 2010-002154) mailed Aug. 20, 2010.
Notification of First Office Action in application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/069,827, dated: Oct. 29, 2010.
Office Action in related U.S. Appl. No. 12/069,827, dated: Apr. 20, 2010.

(56) References Cited

OTHER PUBLICATIONS

Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
CREE® XLAMP® MC-E LEDS Product Info Sheets, pp. 1-3.
Nichia Corporation LEDS, Models NSSM016G, NSSM227, NESM026X, NSSM026BB, NESM005A, 9 Pages.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No. 12/069,827, dated: Oct. 26, 2011.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action from Chinese Patent Application No. 201080001658.4, dated Sep. 24, 2012.
Interrogation from Japanese Patent Application No. 2007-211901. dated Aug. 21, 2012.
Examination Report from European Patent Application No. 07789665 2, dated Aug. 20, 2012.
Decision of Rejection from Chinese Patent Application No 200980009255.7, dated Sep. 5, 2012.
Notification of the First Office Action from Chinese Patent Application No. 201010167346.2, dated Feb. 29, 2012.
Notice of Reasons for Rejection from Japanese Patent Application No. 2009-507195, dated May 8, 2012.
First Office Action for Chinese Patent Application No. 200980153995.2 , dated May 4, 2012.
First Office Action for Chinese Patent Application No. 200910145412.3, dated Apr. 28, 2012.
First Office Action for Chinese Patent Application No. CN 200710152109.7 issued Jul. 29, 2011.
Extended Supplementary European Search Report for European Application No. EP 07789665.2 dated Nov. 7, 2011.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Decision of Rejection for Japanese Patent Application No. 2007-211901, dated: Jan. 30, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.
Third Office Action from Chinese Patent Application No. 200710152109.7, dated: Mar. 5, 2013.
Interrogation from Japanese Patent Application No. 2008-515699, dated Feb. 19, 2013.
First Office Action from Chinese Patent Application No. 201080001658 4, dated Sep. 24, 2012.
Communication from European Patent Appl. No. 09824413.0-1551, dated Feb. 28, 2013.
European Search Report from European Patent Appl. No. 09824413.0/1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Decision of Rejection from Chinese Patent Appl. No. 201080001658.4, dated Jun. 20, 2013.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/022,410, filed Dec. 18, 2012.
Office Action from U.S. Appl. No. 12/069,827, dated Aug. 9, 2012.
Response to OA from U.S. Appl. No. 12/269,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.

(56) References Cited

OTHER PUBLICATIONS

Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
First Office Action for Chinese Patent Application No. 201110039138.9. dated Jun. 4, 2012.
Decision of Rejection from Japanese Patent Application No. 2008-515699, dated Jul. 17, 2012.
Interrogation from Japanese Patent Application No. 2307-211901, dated Aug. 21, 2012.
Examination Report from European Patent Application No. 07789665.2, dated Aug. 20, 2012.
Decision of Rejection from Chinese Patent Application No. 200980009255.7, dated Sep. 5, 2012.
Notice of Reasons for Rejection from Japanese Patent Application No. 2007-211901, dated Apr. 9, 2013.
Decision of Rejection from Japanese Patent Application No. 2011-545616, dated Apr. 26, 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Decision of Rejection from Chinese Patent Appl. No. 201110039138.9 dated Sep. 25, 2013.
Office Action from Japanese Patent Appl. No. 2012-288000, dated Oct. 8, 2013.
Office Action from U.S. Appl. No. 13/652,241, dated Sep. 11, 2013.
Office Action from U.S. Appl. No. 12/002,410, dated Sep. 10, 2013.
Appeal Decision from Japanese Patent Appl. No. 2008-515699, dated Sep. 20, 2013.
Decision of Rejection from Chinese Patent Appl. No. 201001067346.2, dated Aug. 30, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Search Report for European Patent Appl. No. 10731037.7, dated Dec. 11, 2013.
Notice of Reasons for Rejection from Japanese Patent Appl. No. 2011-534993, dated Nov. 12, 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Search Report from Chinese Patent Appl. No. 201210046248.2, dated Apr. 15, 2014.
International Preliminary Report on Patentability from PCT/US2012/065060, dated Jun. 12, 2014.
Office Action from U.S. Appl. No. 11/982,275, dated Apr. 30, 2014.
Office Action from U.S. Appl. No. 12/002,410, dated May 20, 2014.
Fifth Office Action from Chinese Patent Appl. No. 2007/10152109.7, dated Jan. 6, 2014.
Supplemental European Search Report from European Patent Appl. No. 10731337.7, dated Jan. 9, 2014.
Decision of Re-Examination from Chinese Patent Appl. No. 201110039138.9, dated Mar. 13, 2014.
First Office Action from Chinese Patent Appl. No. 201080027586.0, dated Feb. 8, 2014.
Notification of Reexamination from Chinese Patent Appl. No. 2008800092557, dated May 12, 2014.
Examination from European Patent Appl. No. 09 824 413.0-1551, dated May 16, 2014.
Decision on Rejection from Chinese Patent Appl. No. 2007101521097, dated Mar. 17, 2014.
Decision of Rejection from Japanese Patent Appl. No. 2011-259253, dated Mar. 25, 2014.
Office Action from Russian Patent Appl. No 2011146934/28, dated Feb. 28, 2014.
Second Office Action from Chinese Patent Appl. No. 201210046248.2, dated Apr. 15, 2014.
Partial European Search Report from European Patent Appl. No. 082535196-1564, dated Apr. 29, 2014.
Interrogation from Japanese Patent Appl. No. 2009-507195, dated Jan. 28, 2014.
Notification of Designation of the Appeal Examiner from Japanese Patent Appl. No. 2009-507195, dated Jan. 22, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Office Action from U.S. Appl. No. 12/757,891, dated Jan. 14, 2014.
Office Action from U.S. Appl. No. 12/002,410, dated Feb. 4, 2014.
Notification of Reexamination from Chinese Appl. No. 2010800016584, dated Sep. 11, 2014.
Decision to Grant from Russian Patent Appl. No. 2011146934/28, dated Aug. 14, 2014.
Extended European Search Report from European Patent Appl. No. 082535196, dated Aug. 13, 2014.
Office Action from U.S. Appl. No. 12/875,873, dated Jun. 25, 2014.
Response to OA from U.S. Appl. No. 12/875,873, filed Aug. 12, 2014.
Office Action from U.S. Appl. No. 12/069,827, dated Jul. 11, 2014.
Third Office Action and Search Report from Chinese Patent Appl. No. 2011100391389, dated Jun. 23, 2014.
Decision on Appeal from Japanese Patent Appl. No. 2011-545616, dated Jun. 27, 2014.
Reason for Rejection from Japanese Patent Appl. No. 2009-507195, dated Jul. 15, 2014.
Notification of Allowance from Taiwan Appl. Patent No. 103202911, dated Jul. 16, 2014.
Office Action from Japanese Patent Appl. No. 2008-81533, dated Jul. 22, 2014.
Reasons for Rejection from Japanese Patent Appl. No. 2011-534993, dated Oct. 7, 2014.
Second Office Action from Chinese Patent Appl. No. 201080027586.0, dated Sep. 16, 2014.
Notification of Reexamination from Chinese Appl. No. 2010101673462, dated Jan. 12, 2015.
Third Office Action from Chinese Appl. No, 2008800042557, dated Dec. 29, 2014.
Third Office Action from Chinese Patent Appl. No. 2012100462482, dated Oct. 10, 2014.
Decision of Re-Examination from Chinese Appl. No. 200880009255.7. dated Oct. 22, 2014.
Pretrial Report from Japanese Appl. No. 2011-259253. dated Sep. 30. 2014.
Decision of Rejection from Japanese Appl, No. 2012-288000, dated Oct. 28. 2014.

(56) References Cited

OTHER PUBLICATIONS

Decision of Patent Grant from Japanese Appl. No. 2011-534993. dated Dec, 24, 2014.
Office Action from U.S. Appl. No. 11/982,275, dated Oct. 15, 2014.
Office Action from U.S. Appl. No. 12/069,827, dated Oct. 28, 2014.
Office Action from U.S. Appl. No. 12/002,410. dated Nov. 4, 2014.
Office Action fromU.S. Appl. No. 13/652,241. dated Nov. 19, 2014.
Fourth Office Action from Chinese Appl. No. 2011100391389, dated Nov. 24, 2014.

\* cited by examiner

APPARATUS, SYSTEM AND METHOD FOR USE IN MOUNTING ELECTRONIC ELEMENTS

This application claims the benefit and is a divisional of U.S. patent application Ser. No. 11/277,717 to Wong Xuan, et al., which was filed on 28 Mar. 2006.

FIELD OF THE INVENTION

The present embodiments relate generally to mounting electronic devices, and more particularly to surface mount devices.

BACKGROUND

Over the last several decades there has been a dramatic increase in the number and types of devices that are implemented utilizing circuit boards. The frequency with which devices and/or chips are mounted onto circuit boards has similarly grown. Improving the mounting of devices improves the final product incorporating the mounted devices and can significantly reduce the cost and complexity of the product.

The mounting of devices can be achieved through soldering, bonding and other similar methods. Further, devices can be mounted in many different configurations and/or orientations. Some devices are configured to allow one or more orientations for mounting. It can be difficult to mount some of these devices, and further the mounting of some of these devices may deteriorate over time. As a result, the accuracy of the operation of the product incorporating these mounted devices can degrade and/or fail to operate.

SUMMARY OF THE INVENTION

The present embodiments advantageously address the needs above as well as other needs by providing surface mount devices, systems and methods of manufacturing same. Some embodiments provide surface mount devices that comprise a casing having a recess formed extending at least partially into said casing. The device further includes first and second leads each of which is at least partially encased by said casing and each of which has a portion exposed through said recess, wherein at least one of said first and second leads has one or more size reduction features in its said exposed portion that reduces the surface area to provide an increased surface bonding area to said casing around said lead.

Other embodiments provide surface mount devices that comprise a casing comprising a first surface having a recess extending into the casing with first and second leads at least partially encased by said casing, said first lead having a chipset portion at least partially exposed through said recess, said second lead proximate said first lead, said second lead a head portion exposed through said recess, wherein said chipset portion has at least one indentation.

Some further embodiments provide methods for use in manufacturing a surface mount device. These embodiments can comprise providing a first lead element comprising a chipset portion, the chipset portion comprising a first indentation and a second indentation. Providing a second lead element comprising a head portion. Encasing a portion of the first and second lead elements in a casing, the first and second lead elements are positioned apart, the area between the first and second elements define an insulation gap, the second indentation partially defines the insulation gap, and the chipset portion and the head portion terminate interior to the casing. And forming a recess in a first surface of the casing and exposing a portion of the chipset portion, a portion of the head portion, and a portion of the first and second indentations through the recess.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

The above and other aspects, features and advantages of the present embodiments will be more apparent from the following more particular description thereof, presented in conjunction with the following drawings wherein.

Figure 1:
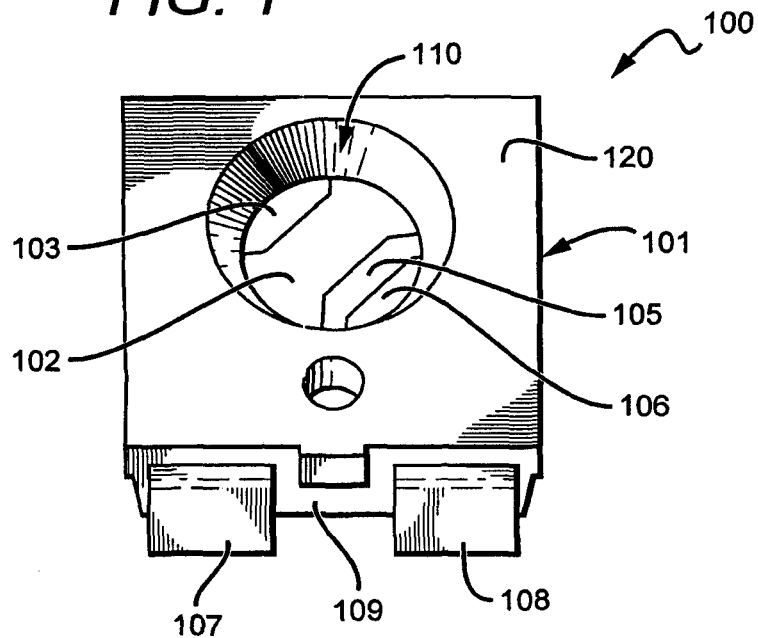
FIG. 1 depicts an overhead view of a surface mount device package according to some embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The present embodiments provide apparatuses, systems, methods of manufacturing and methods for mounting electronic devices, such as mounting an electronic device onto a circuit board. For example, some embodiments are particularly applicable to surface mount device packages used to mount optoelectronic elements that receive, emit, scatter and/or deflect light. The optoelectronic elements can include, for example, one or more of a light emitting diode (LED), a solar cell, a photodiode, a laser diode, and other such optoelectronic elements or combinations of optoelectronic elements. Some embodiments of the surface mount device packages are designed, at least in part, to stabilize the optoelectronic element and/or dissipate heat from the optoelectronic element.

Figure 3:
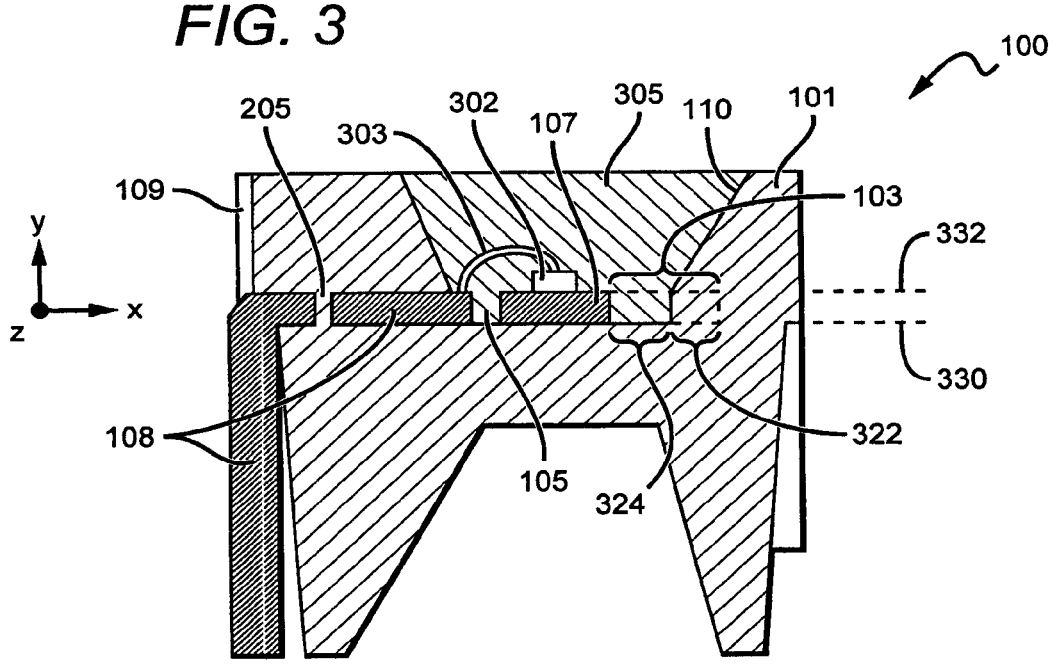
FIG. 3 depicts a simplified, partially transparent view of a cross sectional area of the a surface mount device package of FIG. 1.

FIG. 1 depicts an overhead view of a surface mount device package 100, according to some embodiments, that can be used to mount and electronic device, such as an optoelectronic element (see FIG. 3). The surface mount device package 100 comprises a casing 101, a first lead element 107 and a second lead element 108. The first and second lead elements 107 and 108 are partially encased by the casing 101, and extend through a first surface 109 of the casing 101. After exiting the casing, the first and second lead elements 107 and 108 are bent along the first surface 109.

The first lead element 107 includes a chipset portion 102 where one or more optoelectronic elements, or other electronic elements, can be coupled to the first lead element 107. In some embodiments, the chipset portion 102 of the first lead element 107 includes a first indentation 103 and a second indentation 105 that are vacant of lead material. The second lead element 108 includes a head portion 106 positioned a distance apart from the first lead element 107. The first lead element 107 and the second lead element 108 are electrically isolated by an insulation gap, and in some embodiments, the second indentation 105, in part, provides an insulation gap between the chipset portion 102 and the head portion 106.

A recess 110 is formed or defined in the casing extending from a second surface 120 of the casing 101 into the casing 101 to the first and second lead elements 107 and 108. In some embodiments, the recess 110 extends into the casing 101 and exposes a portion of, at least one of, the first and/or second lead elements 107 and/or 108. The recess 110 may also expose a portion of the first and/or second indentations 103 and/or 105, and/or a portion of the head portion 106.

Figure 2:
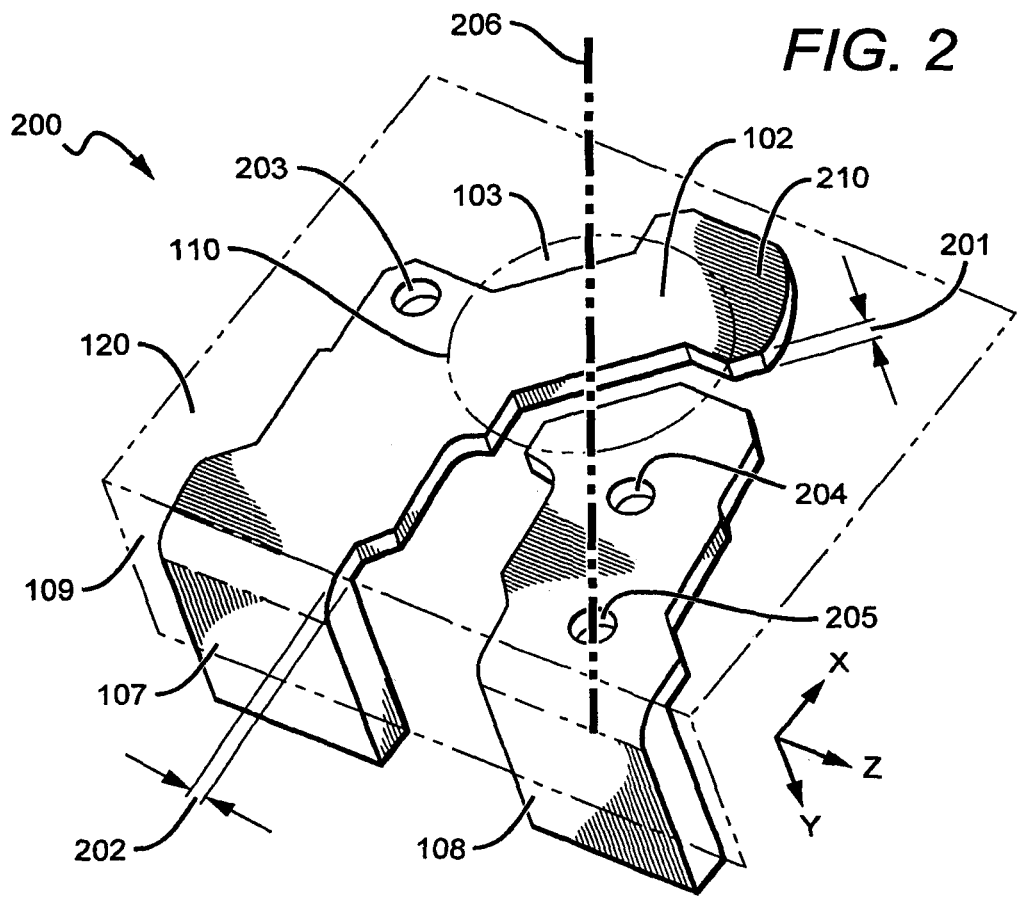
FIG. 2 depicts a perspective view of a lead frame system that can be incorporated in some implementations into the surface mount device package of FIG. 1.

FIG. 2 depicts a perspective view of a lead frame system 200 according to some embodiments that can be incorporated with the surface mount device package 100 of FIG. 1. The lead frame system 200 includes the first and second lead elements 107 and 108. The first surface 109, the second surface 120, and the recess 110 of FIG. 1 of the casing 101 are represented by dashed lines to approximate partial outlines of part of the perimeter of the casing 101 for clarity. The circular dashed line represents the outline of the perimeter of the recess 110 at the surface of lead frame system 200 through which portions of the lead frame system 200 are exposed.

In some embodiments, the first indentation 103 and the second indentation 105 are partially encased by the casing 101 and extend into the area exposed through the recess 110. A first vacant area 203 can further be incorporated in the first lead element 107, and second and third vacant areas 204 and 205 can also be incorporated in the second lead element 108. The thickness of first lead element 107 is indicated by a first thickness 201 and a second thickness 202. The dashed line 206 generally represents a plane of a cross sectional area depicted in FIG. 3. The first lead element 107 is shown with the chipset portion 102 extending into a termination end 210.

FIG. 3 depicts a simplified, partially transparent view of a cross-sectional area of the surface mount device package 100 represented by the plane 206 in FIG. 2. This view shows portions of the first and second lead elements 107 and 108 partially encased in casing 101. The cross-section shows the first lead element 107 including the first indentation 103 with a first portion 322 of the indentation encased by the casing 101 and a second portion 324 of the indentation that extends into the area exposed by the recess 110.

In some embodiments, an optoelectronic element 302 is supported by and/or coupled to the first lead element 107. The optoelectronic element 302 is additionally coupled with the second lead element 108, for example, through a connection 303 (e.g., a bond wire, jump wire or other such connection). Some implementations include a fill material 305 that is disposed in and/or fills at least some of the recess 110 in the casing 101, and in some instances covers the optoelectronic element 302, the exposed portions of the first and second lead elements 107 and 108, and the connection 303. The fill material 305 may also, at least partially, fill the areas exposed by the first and second indentations 103 and 105 (e.g., the second portion 324 of the first indentation 103) extending into and exposed through the recess 110. The cross-sectional view of FIG. 3 also shows the third vacant area 205 of the second lead element 108 that allows casing material to extend through and/or be at least partially filled with casing material.

Referring to FIGS. 1-3, the first and second lead elements 107 and 108 are typically made from electrically conductive material. In some embodiments, the lead element material is also thermally conductive to assist, at least in part, in drawing heat away from the optoelectronic element. The chipset portion 102 of the first lead element 107 may be configured, in part, to support and electrically couple with the optoelectronic element 302. The optoelectronic element is electrically coupled to the chipset portion 102 through an adhesive, coating, film, encapsulant, solder, paste, grease and/or other such methods. In some implementations, the coupling can additionally provide thermal coupling to enhance the dissipation of heat from the optoelectronic element or other electronic device incorporated with the surface mount device package 100.

Similarly, the optoelectronic element 302 is coupled to the second lead element 108 through one or more similar methods. For example, in some embodiments the optoelectronic element 302 is electrically coupled to the head portion 106 of the second lead element 108 through a wire connection 303. Additionally or alternatively, the optoelectronic element may be partially supported by, and coupled to the first lead element 107, and extend over the insulation gap between the lead elements to couple with the head portion 106 of the second lead element 108.

In some embodiments, the first lead element 107 is coupled to a cathode portion of the optoelectronic element 302 and is defined as the cathode lead of the surface mount device 100. Further, the second lead element 108 can couple to an anode portion of the optoelectronic element 302 and be defined as the anode of the surface mount device 100. Thus, the second indentation 105 of the first lead element 107 in part provides for an electrical separation and/or insulation between the anode and cathode of the surface mount device 100.

The casing 101 of the surface mount device 100 encases a portion of the first and second lead elements 107 and 108. In some embodiments, the casing 101 is generally cubical in shape. However, the casing 101 may have substantially any relevant shape, including having multiple portions where a first portion may be a pair of supports or legs. In some embodiments, the casing 101 has markings indicating the type of device, orientation and/or pin numbering.

Further, the casing 101 includes the recess 110 in the second surface 120. The recess 110 extends into the casing 101 to the lead frame system 200 such that at least a portion of the chipset portion 102 of the first lead element 107 is partially exposed. In some embodiments, the recess 110 additionally partially exposes the insulation gap associated with the second indentation 105 and/or the head portion 106 of the second lead element 108. The recess 110 may also expose an area of the head portion 106 where the optoelectronic element couples to the second lead element 108.

In some methods of manufacturing, the optoelectronic element is coupled to the first and second lead elements 107 and 108 prior to constructing and/or assembling the casing 101 about the lead elements 107, 108. Alternatively, the optoelectronic element may be coupled to the lead elements after the lead frame system 200 is partially and/or fully encased within the casing 101. Thus, in some embodiments, the casing 101 may be configured with the recess 110 that extends into the casing such that a sufficient area of at least the chipset portion 102 and the head portion 106 are exposed to receive, mount and secure the optoelectronic device within the recess 110.

The recess 110 is, in part, shaped to expose at least a portion of the optoelectronic element 302, such that when coupled to lead elements the optoelectronic element in some implementations emits and/or receives light through the recess. The recess 110 is, for example, shaped, formed, cut, molded, or constructed into substantially any shape relevant to the surface mount device 100 application. In some embodiments, the recess 110 is generally a conical shape. Alternatively, other shapes, or portions of shapes, can be implemented for the recess 110, such as generally cylindrical, cubical, semi-spherical, octagonal, pyramidal and other relevant shapes. The recess 110 may, at least in part, facilitate the distribution and/or absorption of the light emitted/received from/by the optoelectronic element. In some embodiments, the shape of the recess 110 works in conjunction with the fill material 305 deposited in the recess 110 to, at least in part, enhance the stability of the system.

In some embodiments, the fill material 305 is implemented to protect the exposed optoelectronic element 302. Additionally, the fill material 305 can, in part, enhance the distribution/absorption of light for the optoelectronic element 302. The fill material 305 can be formed from one or more of a resin, an epoxy, a thermoplastic polycondensate (e.g., a polyphthalamide (PPA)), a plastic, glass, nylon and/or other such relevant materials and/or combinations of materials. In some embodiments, additional materials are added to the fill material 305 to enhance the emission, absorption and/or dispersion of light to and/or from the optoelectronic element 302.

Still referring to FIGS. 1-3, the first and second lead elements 107 and 108 of the lead frame system 200 are partially encased by the casing. In some embodiments, the thickness of the first lead element 107 and/or second lead element 108 is substantially even in thickness and flat along a least a portion of the length of the lead elements encased in the casing. The encased portions of the first and second lead elements 107 and 108 lay substantially in the same plane. For simplicity, the portion of the casing 101 beneath a plane 330 created by surfaces of the first and second lead elements 107 and 108 facing away from the recess 110 is referred to below as being "beneath" the lead element, and the portion of the casing 101 above a plane 332 created by the surfaces of the first and second lead elements 107 and 108 facing the recess is referred to as being "above" the lead element. In some implementations, the casing material, fill material 305 and/or other material (e.g., epoxy, resin, adhesive, and other such relevant material) extend partially into and/or through one or more of the areas vacant of lead material shaped by the first and/or second indentations 103 and/or 105, vacant areas 203-205 through holes, beveled corners and/or other recesses. For example, those vacant areas encased by the casing 101 can be at least partially filled with casing material, one or more pegs extending through the vacant areas and other such configurations.

In some embodiments, the portions of the first and second lead elements 107, 108 extending beyond the first surface and exterior to the casing have a thickness that is greater than the thickness (e.g., thickness 202) of the portions of the first and second lead elements that are interior to the casing 101. For example, the first and second lead elements 107 and 108 can increase in thickness upon protruding through the first surface 109 of the casing 101. The thicknesses of the lead elements 107 and 108 begin to increase at about the first surface 109 of the casing 101, where the lead elements 107 and 108 are bent along the first surface 109. In other instances the increase in thickness begins prior to exiting the casing 101 and continues to increase to a final thickness exterior to the casing. Alternatively, the lead elements 107 and 108 can be substantially equal in thickness and maintain the thickness after exiting the first surface 109 of the casing 101.

As illustrated in FIGS. 1-3, the first and second indentations 103 and 105, and further the area within and shaped by the indentations 103 and 105, are partially encased by the casing 101 and further extend into the area defined by the perimeter of the recess 110. For example, the first indentation has an encased portion 322 and an un-encased or exposed portion 324. The encased portion 322 of the first indentation 103 exposes the casing beneath the encased portion 322 of the first indentation 103 to the casing above the encased portion 322. Further, the portion of the casing 101 below the exposed or un-encased portion 324 of the first indentation 103 is exposed to the recess 110, and in some implementations, the un-encased portion 324 is further filled with fill material 305. Similarly, a portion of the second indentation 105 is encased by the casing 101 allowing casing material to extend through the second indentation 105, and the portion of the second indentation 105 that extends into the recess area exposes a portion of the casing 101 beneath the first lead element 107 to the recess 110 and/or fill material 305. The configuration of the lead frame system 200, with the first and/or second indentations 103 and/or 105, in part, increases surface bonding areas around the lead elements including the casing beneath the lead elements exposed by the vacant areas to bond with the fill material and/or casing material above the lead elements and/or extending through the vacant areas.

The enhanced bonding provided through and around the first and second lead elements 107 and 108, at least in part, enhances the stability of the lead frame system 200 relative to the casing and the structural integrity of the surface mount device package 100. The structural integrity is further maintained, at least in part, through the lead elements 107 and 108 adhering to the casing 101, the fill material 305, and/or the optoelectronic element 302. In some embodiments, however, the bonding or adhesion between casing material, and/or between casing material and fill material is greater than the bonding or adhesion established between the casing and the lead elements, and between the lead elements and the fill material. Further, during use in some implementations the lead elements can increase in temperature and this increase in temperature can cause deterioration in the adhesion or bonding between the lead elements and the casing, and/or between the lead elements and the fill material. Poor adhesion between components of the surface mount device 100 may lead to a deterioration of the device. For example, poor adhesion between the lead elements 107 and 108 and the casing 101 may allow the lead elements 107 and 108 to shift inside the surface mount device 100. A shifting of the lead elements 107 and 108 may lead to a disposition of the optoelectronic element, a deterioration of the device 100, and/or may eventually lead to failure. Some embodiments increase the adhesion between the casing, and between the fill material 305 and the casing 101 further contributing to maintaining the configuration and structural integrity of the surface mount device 100.

The first and/or second indentations 103 and/or 105 in the chipset portion 102 increase the adhesion areas around the lead element 107, and in part facilitate securing the lead element 107 and the optoelectronic element 302. Further, by incorporating casing material and/or fill material into vacant areas, the relative positioning of the chipset portion 102 and/or optoelectronic element 302 are more precisely maintained. The increased stability of the optoelectronic device further improves performance of the surface mount device 100 and increases reliability of the surface mount device. In some embodiments, the adhesion capacity between the components of the surface mount device 100 is further enhanced by increasing the area exposed by the recess 110. For example, the diameter of the recess 110 at the surface of the chipset portion could be increased to expose the casing 101 outside of the chipset portion 102. However, the real estate available for the recess 110 is limited, and a change in the recess 110 may affect the emission/absorption of the light from/by the optoelectronic element 302.

Further, in some implementations, some mounting devices may be subjected to an environment with heat and/or vibration. Accordingly, the shape of the first and/or second lead elements 107, 108 and/or the recess 110 are designed in some embodiments to, at least in part, increase the adhesion areas around and/or through the lead elements of the surface mount device 100. Further, at least the first and second indentations 103 and 105 further maintain positioning of the chipset portion relative to the casing 101 and thus increase stability of the device and optoelectronic device. An increase in adhesion areas at least in part increases the stability of the components and secures positioning such that the devices can be accurately and reliably utilized in adverse conditions including relatively high heat and/or subject to relatively large amounts of vibration.

Still referring to FIGS. 1-3, additional indentations or vacant areas may be included in some embodiments to, at least in part, further increase the adhesion areas of the lead frame system 200 inside the casing 101 and/or further maintain the positioning of the lead frame system 200 within the casing. In some embodiments, a first vacant area 203 is included in the first lead element 107. A second vacant area 204 and a third vacant area 205 can similarly be included in the second lead element 108.

In some implementations, the first, second and/or third vacant areas 203, 204, and 205 are generally circular in shape, similar to through holes or bores extending through the lead elements. Other shapes may be implemented for these vacant areas (e.g., square, rectangular, triangular, irregular, or other relevant shapes or combination of shapes). The first and second indentations 103 and 105 and the first, second and third vacant areas 203, 204, 205 may be formed or fashioned through many different methods, such as molded, bored, drilled, etched, punched out, cut, filed, or other such methods and/or combinations of methods.

As described above, the first and second lead elements 107 and 108 may have a poor adhesion capacity with the casing material and/or fill material 305. Direct coupling of the casing 101 material through the vacant areas to the casing 101 above and beneath the vacant areas of the lead elements 107 and 108 at least in part further secures the positioning of the lead elements 107 and 108 within the surface mount device 100. Additionally or alternatively, an adhesive material can be utilized to at least partially fill the indentations 103, 105 and/or vacant areas 203, 204, and 205 to adhere the casing 101 and/or fill material 305 above the first and second lead elements 107 and 108 to the casing 101 beneath the lead elements. The adhesive material could be substantially any relevant material that adheres to the casing and/or fill material, such as glue, epoxy, resin, and other types of relevant adhesive material.

The casing 101 can be formed and/or assembled through one or more methods. In some embodiments, the casing 101 is formed or molded around the lead elements 107 and 108. Additionally or alternatively the casing can be molded into sections, for example, a top and a bottom. Each section may incorporate molding that facilitates, in part, securing the lead elements with the sections of the casings. The top and bottom portions are secured together, sandwiching portions of the first and second lead elements 107 and 108, for example, with adhesive material, peg and slots, snap fit, friction fit, and or other relevant methods. In other embodiments, a base section may be pre-molded allocating space for the lead elements 107 and 108 to be secured onto the base of the casing 101, and a top section of the casing 101 is formed, molded or poured over the lead elements 107 and 108.

For example, the top portion of the casing can be formed by pouring casing material over the top of a portion of the lead elements that are coupled to a base section. In this case, the vacant areas such as the first, second and third vacant areas 203, 204, and 205, and portions of the first and second indentations 103 and 105, not exposed by the recess 110, are covered by and at least partially filled in with casing 101 material. The insulation gap between the lead elements and beveled corners not exposed by the recess 110 may also be at least partially filled by the casing 101 material. In other embodiments, the bottom of the casing 101 is molded such that casing material beneath the lead elements extends through the vacant areas, insulation gap, indentations, and/or around beveled corners, to mate or cooperate with a top portion of the casing 101 above the lead elements. In some implementations, the casing 101 can include pegs that extend through the vacant areas, insulation gap, and/or beveled corners to couple with slots in the casing opposite the pegs. In other embodiments, the vacant areas, insulation gap, indentations, and/or beveled corners contain adhesive material that secures sections of the casing 101 together about the first and second lead elements.

In some embodiments of manufacturing, the fill material 305 is a liquid or semi-liquid that is poured into the recess 110 of the casing 101. FIG. 3 depicts an implementation where the fill material 305 substantially fills the exposed portion 324 of the first indentation 103. The fill material 305 adheres to the casing 101 beneath the first lead element 107 through the exposed portion 324 of the vacant area 103. Additionally or alternatively, the recess 110 exposes a portion of the insulation gap between the lead elements that, in some embodiments, is shaped by the second indentation 105 (see at least FIGS. 1 and 2). The exposed portions of the second indentation 105 and the insulation gap are, at least partially, filled with fill material 305. The fill material 305 adheres to the casing 101 beneath the first lead element 107 exposed by the second indentation 105.

Figure 4:
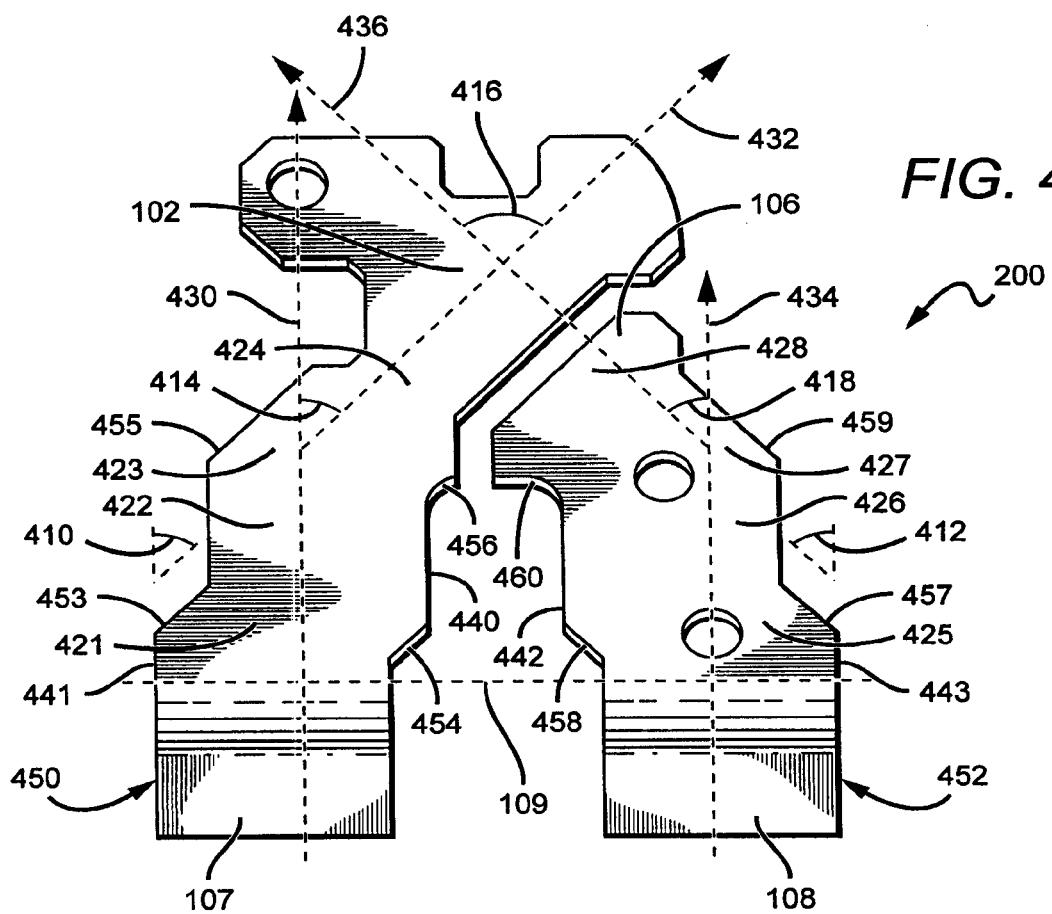
FIG. 4 illustrates an overhead perspective view of the lead frame system of FIG. 2.

FIG. 4 illustrates an overhead perspective view of the lead frame system 200 including the first and second lead elements 107 and 108. The first lead element 107 has a first coupling portion 450 that is partially exterior to the casing 101 and is used to couple the surface mount device 100, for example, to a circuit board. As seen in the overhead view, the first coupling portion 450 of the first lead element 107 extends into the casing 101 through the first surface 109 generally in a first direction 430. The chipset portion 102 of the first lead element 107 extends from the first coupling portion 450 of the first lead element 107 generally in a second direction 432. The second direction 432 is at a first acute angle 414 relative to the first direction 430.

The second lead element 108 has a second coupling portion 452 that is partially exterior to the casing 101 and is used, for example, to couple the surface mount device 100 to a circuit board. The second coupling portion 452 of the second lead element 108 extends into the casing 101 through the first surface 109 generally in a third direction 434 that, in some embodiments, is approximately parallel with the first direction 430. The head portion 106 of the second lead element 108 extends from the second coupling portion 452 generally in a fourth direction 436. The fourth direction 436 is at a second acute angle 418 relative to the third direction 434. The second direction 432 of the extending chipset portion 102 and the fourth direction 436 of the extending head portion 106 are at a third angle 416 relative to each other, and in some embodiments are substantially perpendicular to each other.

In some embodiments, the coupling portions 450, 452 of the first and second lead elements 107, 108 are stepped or staggered and include one or more stepped or shifted portions. For example, the coupling portion 450 of the first lead element 107 can temporarily shift for a first shifted or stepped portion 421 at a fourth angle 410 relative to the first direction 430. Following the first stepped portion 421, the coupling portion 450 continues to extend generally in the first direction 430 along a first extended portion 422. Additionally, in some embodiments the first lead element 107 includes a second stepped portion 424 such that the coupling portion temporary shifts in the same general direction as the fourth angle 410 for the second stepped portion 423, and then continues to extend along a second extended portion 424 in the first direction.

The second coupling portion 452 of the second lead element 108 can include a third stepped portion 425 temporarily extending in a general direction of a fifth angle 412 relative to the third direction 434. Following the third stepped portion 425, the second lead element 108 continues to extend generally in the third direction 434 along a third extended portion 426. A fourth stepped portion 427 can additionally be included in the second lead element 107 temporary shifting in the same general direction as the fifth angle 412, and then continues to extend in the third direction 434 for a fourth extended portion 428, and/or in some embodiments the head portion 106 extends from the fourth stepped portion 427.

In some implementations, the fourth angle 410, at which the first and third stepped portions 421, 423 extend relative to the first direction 430, is substantially equivalent to the first angle 414 at which the chipset portion 102 extend from the coupling portion 450 of the first lead element 107. Similarly, the fifth angle 412, at which the third and fourth stepped portions 425, 427 of the second coupling portion 452 extend relative to the third direction 434, is substantially equivalent to the second angle 418 at which the head portion 106 extends from the coupling portion 452 of the second lead element.

Figure 5:
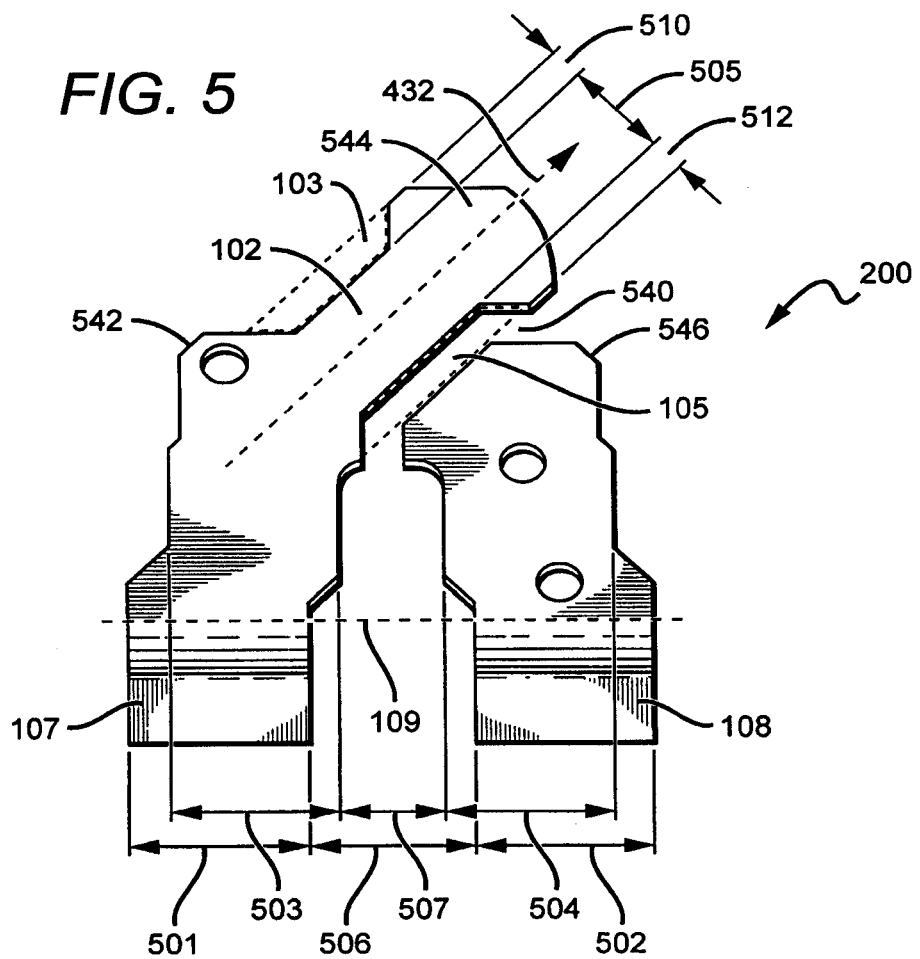
FIG. 5 depicts a perspective view of the lead frame system similar to that of FIG. 4.

FIG. 5 depicts a perspective view of the lead frame system 200, similar to that of FIG. 4. As discussed in regards to FIG. 4, the coupling portions 450, 452 of the first and/or second lead elements 107 and/or 108 may include or make one or more temporary shifts prior to the chipset portion 102 and the head portion 106 extending from the first and second lead elements respectively. Interior to the casing, proximate the first surface 109, the first lead element 107 has a first width 501 and the second lead element 108 has a second width 502 with a first distance 506 of separation between the first and second lead elements. The first and third extended portions 422 and 426 following the first stepped portion 421 of the first lead element 107 and the third stepped portion 425 of the second lead element 108, respectively, have third and fourth widths 503 and 504, respectively, with a second separation distance 507 between the lead elements. In some implementations, the third and fourth widths 503 and 504 are substantially equal to the first and second widths 501 and 502. In other embodiments, however, the third and fourth widths 503 and 504 of the first and second lead elements can be increased or decreased widths relative to the first and second widths 501 and 502.

In some embodiments, the chipset portion 102 of the first lead element 107 includes the first indentation 103 and the opposing second indentation 105 on an opposite edge of the chipset portion and extending along a length of the chipset portion 102 generally in the second direction 432, such that the first and second indentations are on opposite sides of an axis bisecting the chipset portion along the second direction 432. The first indentation 103 generally has a first depth 510, and the second indentation 105 generally has a second depth 512. The dimensions of the first indentation 103 can depend on one or more factors, such as the intended implementation of the surface mount device package and/or the electronic device to be incorporated into the surface mount device package 100, and in some implementations has a depth 510 between about 0.16 mm and 0.26 mm, and in some instances be about 0.21 mm±0.05 mm, with an area greater than about 0.15 sq. mm., and in some instances greater than about 0.2 mm, for example, greater than about 0.239 sq. mm. Similarly, the dimensions of the second indentation 105 can depend on one or more factors including an intended implementation and/or the electronic device to be incorporated into the surface mount device package 100, and in some embodiments has a depth 512 between about 0.20 mm and 0.30 mm, and in some instances be about 0.24 mm±0.05 mm, with an area greater than about 0.25 sq. mm., and in some instances greater than about 0.3 mm, for example, greater than about 0.3322 sq. mm. In some embodiments, the ends of the indentations 103 and 105, taper away from the sides of the chipset portion 102 to the first lead element 107 and/or the termination end 210 at angles of about ±degrees. The chipset portion 102 has a fifth width 505 at the shortest distance between the first and second indentations 103 and 105. Again, the dimensions of the chipset portion 102 can depend on one or more factors including an intended implementation and/or the electronic device to be incorporated into the surface mount device package 100. In some embodiments, the fifth width 505 of the chipset portion 102 is greater than about 0.6 mm, in some implementations greater than 0.75 mm.

The first and second lead elements 107 and 108 maintain electrical isolation with an insulation gap 540, and in some embodiments the second indentation 105 comprises at least a portion of the insulation gap 540. In some embodiments, the chipset portion 102 further comprises an expanded or protruding termination portion 544 that extends beyond the perimeter of the recess 110 and into the interior of the casing 101 to be encased in the casing. The termination portion 544 of the first lead element 107 can be configured with rounded or beveled edges and/or corners. In some implementations, one or more additional corners of portions of the first and second lead elements 107 and 108 encased by the casing can be beveled or rounder. For example a first corner 542 on the first lead element proximate the chipset portion and a second corner 546 on the second lead element 108 proximate and/or part of the head 106 may be rounded or beveled. Other corners can similarly and/or additional be rounded or beveled.

Referring to FIGS. 1-5, in some embodiments, interior to the perimeter of casing 101 the first and second coupling portions 450, 452 of the first and second lead elements 107, 108, respectively, extend into the casing 101 and generally away from the first surface 109 of the casing along the first and third direction 430, 434, which in some implementations are substantially parallel such that the first and second coupling portions are generally parallel. The chipset portion 102 extends from the first coupling portion 450 generally toward an axis of the second lead element 108 extending along the second direction at the first angle 414 that is less than ninety degrees from the first direction 430 along the second direction 432. The head portion 106 of the second lead element 108 extends away from the second coupling portion 452 toward the chipset portion 102 at the second angle 418 that is less than ninety degrees away from the third direction 434 along the fourth direction 436. In some embodiments, the second direction 432 and the fourth direction 436 are substantially perpendicular to each other.

A first edge 440 (referred to below in some instances as an interior edge) of the first coupling portion 450 proximate the second lead element 108 and the first edge 442 (referred to below in some instances as an interior edge) of the second coupling portion 452 proximate the first lead element 107 follow generally similar stepped or shifting patterns. The first edge 440 of the coupling portion 450 of the first lead element 107, in some instances, is mirrored by the first edge 442 of the coupling portion 452 of the second lead element 108. In some embodiments, the interior edges 454, 456, 458 and 460 of the stepped portions 421, 423, 425 and 427, respectively, can be configured to be more rounded, beveled, extended, shortened and/or occur closer to the first surface 109 of the casing as compared to respective outer edges 453, 455, 457 and 459 of the stepped portions 421, 423, 425 and 227, respectively, of the first and second coupling portions 450, 452.

In some embodiments, the first and second coupling portions 450, 452 maintain the first and second widths 501 and 502 as they extend into the casing and away from the first surface 109 of the casing 101. For example, the first coupling portion 450 can be configured such that the first and second sides 440, 441 shift in a substantially equivalent manner during the stepped portions 421, 423 maintaining substantially the first width 501 throughout the stepped portions 421, 423 (i.e., the first width 501 is substantially equivalent to the third width 503). Additionally or alternatively, the interior edge 454 of the first stepped portion 421 initiates the stepped transition closer to the first surface 109 of the casing 101, has more rounded transitions, and/or is shorter than an exterior edge 453 of the first stepped portion 421. The interior edge 456 of the second stepped portion 423 for example, can similarly begin closer to the first surface 109 of the casing, be more curved, and/or extend for longer than the exterior edge 455 of the second stepped portion 423. In some alternative embodiments, the width of the first lead element 107 decreases during the temporary stepped transitions such that the first width 501 is greater than the third width 503.

Similarly, in some embodiments, both sides 442, 443 of the second coupling portion 452 of the second lead element 108 shift in a substantially equivalent manner during the stepped portions 425, 427 such that the second lead element 108 maintains substantially the same second width 502 (i.e., the second width 502 is substantially equivalent to the fourth width 504). Additionally or alternatively, the interior edge 458 of the third stepped portion 425 begins shifting closer to the first surface 109 of the casing 101, has more rounded transitions between adjacent portions, and is shorter than the exterior edge 457 of the third stepped portion 425. The interior edge 460 of the fourth stepped portion 427, for example, initiates the transition closer to the first surface 109 of the casing, is more curved, and extends for longer than the exterior edge 459 of the fourth stepped portion 427. Further, in some embodiments, the width of the second lead element 108 decreases during the temporary shifts such that the second width 502 is greater than the fourth width 504. In other embodiments the width of the first and second lead elements 107 and 108 increase during the shifting transitions (e.g., the third width 503 is greater than the first width 501 and the fourth width 504 is greater than the second width 502).

In some embodiments, the width 501 of the first lead element 107 is greater than the shortest distance 505 between the first indentation 103 and the second indentation 105. Further in some embodiments, the first lead element 107 and the second lead element 108 both attain widths 501, 502 greater than 0.8 mm, typically greater than 1.0 mm (e.g., 1.5 mm, 3.0 mm, or greater) prior to extending through the first surface 109 and exiting the casing 101, and maintains these widths 501, 502 outside of the casing 101. Maintaining the widths 501, 502 outside of the casing 101 may also, in part, facilitate the mounting of the surface mount device 100, such as mounting to a circuit board.

The first and second indentations 103 and 105 are configured to extend into the area exposed by the perimeter of the recess 110 in the casing 101 to expose additional areas of the casing through the recess. In some embodiments, the first and second indentations 103 and 105 are generally trapezoidal shaped, where the parallel sides of the trapezoid are generally parallel to the second direction 432 along which the chipset portion 102 extends. In some embodiments, the trapezoidal areas of the first and second indentations 103 and 105 are substantially equivalent. In other embodiments, one indentation can be larger than the other, and the first and/or second indentations 103 and 105 may be configured in substantially any relevant shape, including but not limited to rectangular, tapered, rounded or semi-circular, multiple straight and/or rounded edges, partially tapered and substantially flat, or other relevant shape or combination of shapes.

In some embodiments, the second indentation 105 is proximate the head portion 106 of the second lead element 108, and the head portion 106 may generally parallel or mimic the edges or shape of the second indentation 105. The head portion 106 may partially extend into the area of the second indentation 105, for example, into the trapezoidal area while the insulation gap 540 is maintained between the first and second lead elements 107 and 108, which can be partially defined by the second indentation 105. In other embodiments the insulation gap 540 is larger than the second depth 512 of the second indentation 105.

In some implementations, a first corner 542 of the first lead element 107 and/or a second corner 546 of the second lead element 108 are beveled or rounded, (e.g., partially removed, cut, formed, molded, and/or filed into a rounded or beveled shape). The first and second corners 542 and 546 may be shaped substantially round, substantially straight or diagonal, partially straight and partially rounded, with multiple straight edges, or other relevant shapes or combination of shapes. In some embodiments, the first corner 542 is beveled at an angle similar to the first and third stepped portions 421 and 423, and the second corner 546 is beveled at an angle similar to the fifth and seventh stepped portions 425 and 427.

The configurations discussed above in part increase the area of adhesion around the first and second lead elements 107 and 108 by increasing an amount of casing 101 material exposed through at least the first and second indentations 103, 105 beneath the first lead element 107 to casing 101 above the lead element, increases the stability of the position of the lead frame system 200 relative to the casing 101 and the stability and/or precision of the positioning of the optoelectronic element 302 in the surface mount device 100 in part through the indentations 103, 105, vacant areas 203-205 and stepped portions 421, 423, 425 and 427 with casing material, fill material and/or adhesive material extending through and/or around the first and second lead elements 107, 108.

Figure 6:
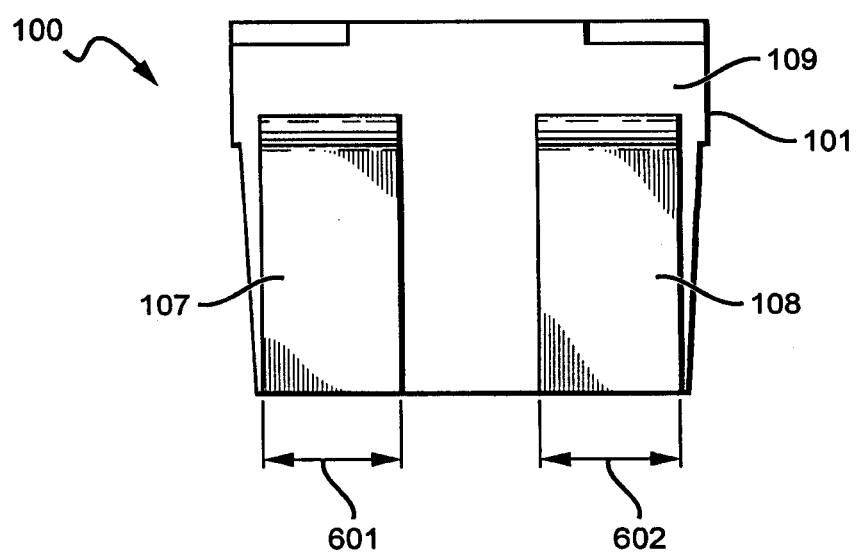
FIG. 6 depicts a side view of the surface mount device package of FIG. 1.

FIG. 6 depicts a side view of the surface mount device package 100 of FIG. 1 showing the first and second lead elements 107 and 108 extending through the first surface 109 of the casing 101 and bent along the first surface 109. The first lead element 107 maintains a first width 601 outside of the casing 101, and the second lead element 108 maintains a second width 602 outside of the casing. Further, the first lead element 107 in some implementations attains the first width 601 upon exiting the casing, and substantially maintains that first width 601 outside of the casing. In some embodiments, the width 601 of the first lead element 107 outside the casing 101 is substantially equal to the first width 501 of the first lead element 107 inside the casing attaining the width 501 prior to extending through the first surface 109, and the width 602 of the second lead element 108 can be substantially equal to the second width 502 of the second lead element 107 inside the casing 101, and in some implementations attains the width 502 prior to extending through the first surface 109 and maintains the width 602 along the first surface 109. In some embodiments, the first and second lead elements 107 and 108 have widths 601 and 602 that are greater than 0.8 mm, typically 1.0 mm or greater, such as 1.3 mm or more. These widths may, in part, facilitate the bond of the surface mount device 100 with, for example, a circuit board.

Figure 7:
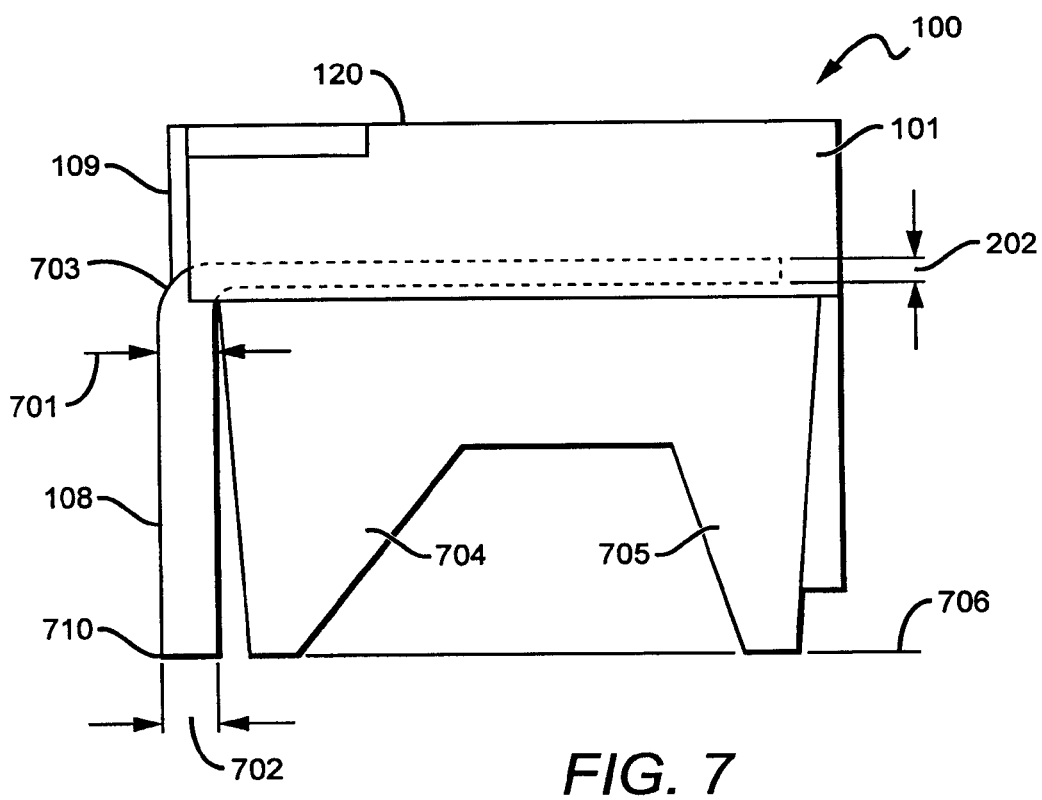
FIG. 7 depicts a partially transparent side view of the surface mount device of FIG. 1.

FIG. 7 depicts a partially transparent side view of the surface mount device 100. The second lead element 108 is shown extending through the first surface 109 of the casing 101 and is bent 703 to be positioned along the first surface 109. In some embodiments, the second lead element 108 terminates at a point 710 that is about equal to an end 706 of the first surface 109 and/or the casing 101. Further, the second lead element 108 is shown with a termination thickness 702 that is greater than the interior thickness 202 of the portion of the second lead element 107 encased in the casing 101. In some embodiments, the second lead element 108 may attain an initial external thickness 701 after being bent 703, and the termination thickness 702 at the termination 710 of the lead element. In some implementations, the external thickness 701 can be about equal with the termination thickness 702; however, in some instances, the lead can continue to increase in thickness as it extends from the bend 703 and along the first surface 109 of the casing to the termination 710 having the termination thickness 702 that is greater than the initial external thickness 701. The first lead element 107 can be similarly configured with a thickness exterior the casing that is greater than a thickness of the portion encased in the casing. The thicknesses can depend on the size and shape of the surface mount device 100, the surface to be mounted on, the shape of the casing 101 and/or anticipated use.

In some embodiments, the casing 101 is generally cubicle and the end 706 of the casing 101 is substantially flat or level. Additionally or alternatively, the casing 101 comprises first and second leg portions 704 and 705. The lead elements 107 and 108 terminate 710, in some implementations, prior to the end 706 of the casing 101. In other implementations, the termination 710 of the lead elements 107 and 108 is substantially level with the end 706 of the first and second legs 704 and 705.

Figure 8:
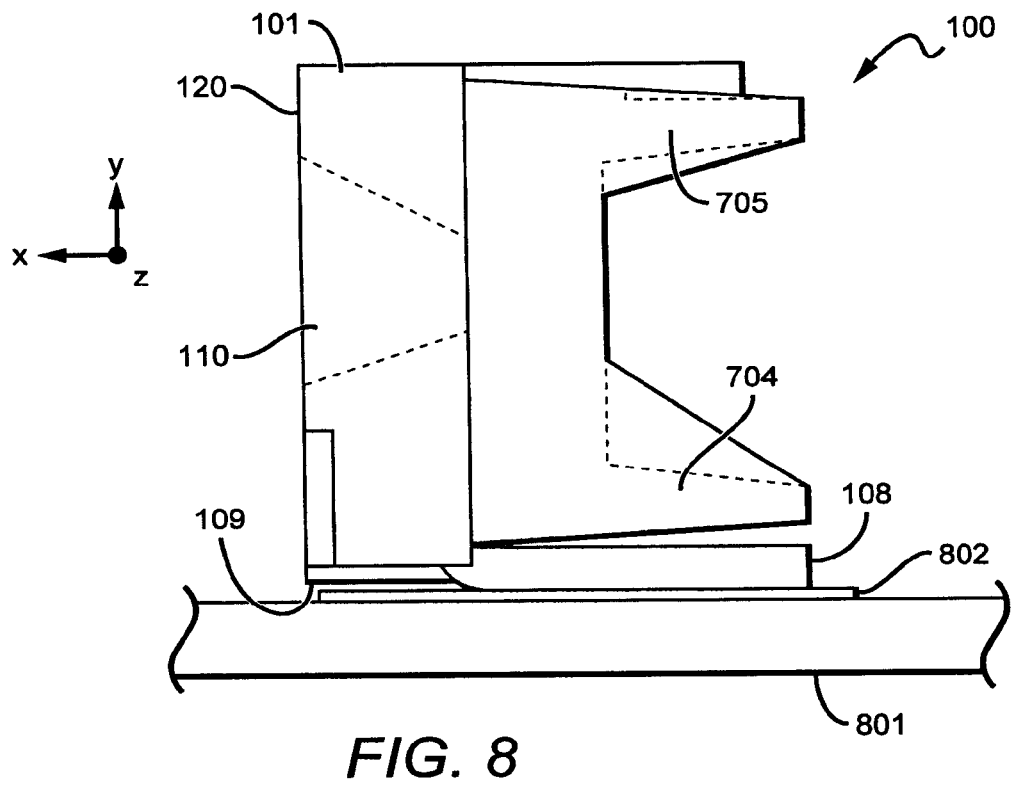
FIG. 8 generally depicts a partially transparent, side view of the surface mount device of FIG. 1 mounted and/or coupled, for example, to a circuit board.

FIG. 8 generally depicts a partially transparent, side view of the surface mount device 100 mounted and/or coupled, for example, to a circuit board 801. In this configuration, the first and second lead elements 107 and 108 exit the casing 101 through the first surface 109, allowing for a side mount installation. As installed, the surface mount device 100 can emit and/or receive light through the recess 110 in the second surface 120. The second lead element 108 is coupled to a solder pad 802 formed on the circuit board 801. The first lead element 107 (not shown in FIG. 8) can similarly be coupled or bonded with the circuit board 801, where the first lead element 107 is coupled to a separate solder pad (not shown) that is electrically isolated or insulated from the solder pad 802 coupled with the second lead element 108.

Some embodiments provide surface mount devices that at least in part improve the stability and positioning of the lead elements 107 and 108 and the electronic element 302 within the surface mount device through the configuration and design of the lead frame system 200. In some embodiments, this is accomplished, in part by increasing exposed and/or adhesion areas of casing material around the lead elements 107 and 108 through the implementation and configuration of the first and/or second indentations or vacant areas 103, 105 extending from within the casing and into the area exposed by the recess 110. The first and/or second lead elements 107 and/or 108 can further be configured and/or constructed to additionally draw heat away from the optoelectronic element 302 produced during operation. Typically, the lifetime of an optoelectronic element can be maximized and/or extended by reducing the amount of heat the optoelectronic element absorbs.

Some embodiments augment and/or compensate for the reduced area of the chipset portion 102 due to the first and second indentations 103 and 105 by augmenting other areas of the first lead element 107. For example, when implementing one or more of the indentations and/or vacant areas 103, 105, 203, 204, 205, and/or 540, the overall area of first lead element 107 may be compensated by increasing the widths 501, 503, 601 of the first lead element 107 (and/or second lead element 108), termination end 210, head portion 106, and/or other areas.

Additionally or alternatively, the lead elements 107 and 108 can be configured with thicknesses (e.g., external thicknesses 701, 702) that increase the overall volume and/or area of the lead elements and in part maintain or increase the capacity of the first and/or second lead elements ability to absorb and draw heat away from the optoelectronic element. Increasing the thickness 702 of the lead elements 107 and 108 may also facilitate and/or enhance the coupling of the surface mount device 100 to a circuit board. For example, the external thicknesses 701 and/or 702 of the lead elements 107 and 108 can be greater than 0.10 mm, typically greater than 0.15 mm, and often increased to 0.3 mm or more.

Figure 9:
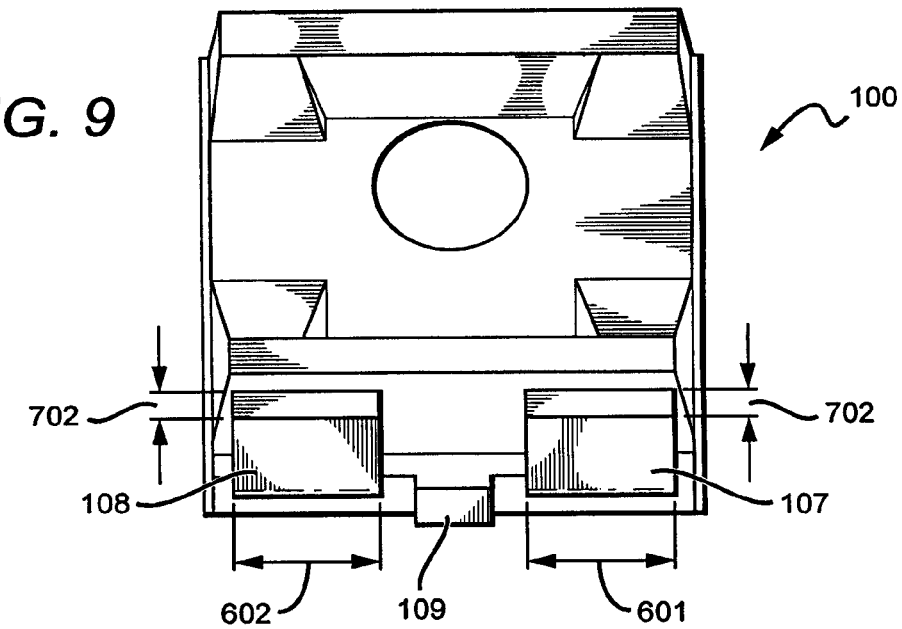
FIG. 9 depicts an inverted view of the surface mount device package of FIG. 1.

FIG. 9 depicts a perspective view of the surface mount device package 100 of FIG. 1 as viewed from the end 706 opposite the second surface 120 showing the first and second lead elements 107 and 108 extending through the first surface 109 of the casing 101 and bent along the first surface 109. The first lead element 107 maintains a first width 601 outside of the casing 101, and the second lead element 108 maintains a second width 602 outside of the casing. Further, the first and second lead elements 107 and 108 at least terminate with the termination second thickness 702.

Figure 10:
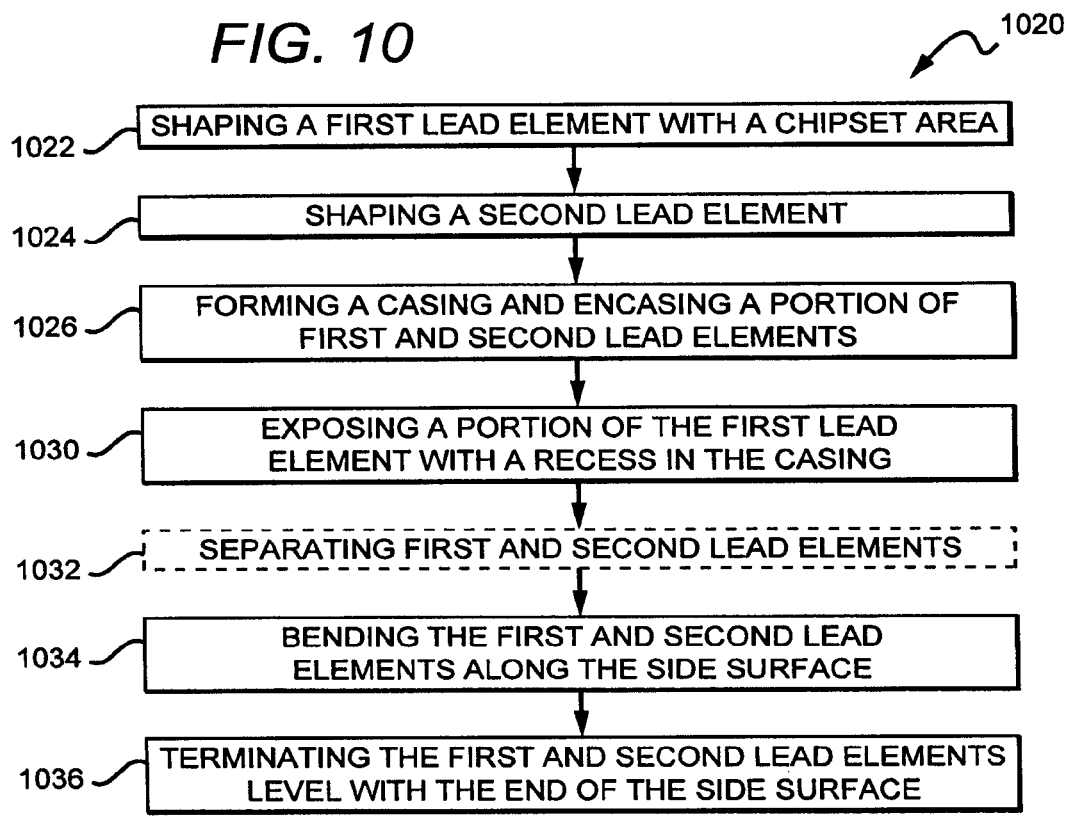
FIG. 10 depicts a flow diagram of a process for use in manufacturing a surface mount device according to some embodiments.

FIG. 10 depicts a flow diagram of a process 1020 for use in manufacturing a surface mount device 100 according to some embodiments. In step 1022, a first lead element 107 with a chipset portion 102 is shaped. In some implementations, the chipset portion 102 is electrically secured with the external coupling portion 450. The chipset portion may, in part, be shaped to couple to, and in some instances support, an optoelectronic element. In step 1024, the second lead element 108 is shaped. The shaping of the first and/or second lead elements 107 and 108 can be achieved through metal stamping, injection molding, cutting, etching or through other methods and/or combinations of methods. Further, the shaping of the first lead element may include shaping the chipset portion in a generally triangular shape, and defining one or more vacant areas as indentations in one or more edges of the chipset portion. In some implementations, steps 1022 and 1024 are preformed simultaneously. For example, if the first and second lead elements 107 and 108 are metal stamped (e.g., stamped simultaneously from a single sheet of relevant material).

In step 1026, the casing 101 is formed and/or secured with the first and second lead elements 107 and 108. In some embodiments, the casing is formed through an injection molding process molding the casing in the desired shape about the first and second lead elements. In other implementations, the casing can be shaped to fit with the lead elements and then secured with the lead elements through adhesive, friction fits, pegs and slots, and other relevant methods. In step 1030, the recess 110 is formed and/or the chipset portion 102 is cleared and exposed such that portions of the first and second indentations 103, 105 extend into and are exposed through the recess 110. In those implementations where the casing 101 is injection molded the recess may be formed while molding. The chipset portion, however, may include some residual casing material and/or other stray material. This residual or stray material is removed in step 1030. In other embodiments, the recess is cut, etched or otherwise formed through the second surface 120 of the casing 101.

In some embodiments, the process 1020 includes an optional step 1032 where the first and second lead elements are separated from a support structure and/or sheet of metal. In some implementations where the first and second lead elements are cut or stamped from a sheet of relevant material, the first and second leads may not be fully separated to allow for easy of handling of the leads and/or to increase production by mass processing multiple surface mount devices 100 at a time.

In step 1034, the portions of the first and second lead elements 107 and 108 exiting the casing 101 are bent along the first surface 109 of the casing. In step optional 1036, the ends of the first and second lead elements 107 and 108 are cut when needed such that the ends of the first and second lead elements terminate at about the end 706 of the casing. In some instances, the first and second leads are initially cut or formed with lengths to closely or precisely align with the end 706 of the casing.

Variations to the process 1020 can be employed in some embodiments. For example, the process 1020 can include steps of forming a top portion of the casing and a bottom portion of the casing. Step 1026 can instead provide for the top and bottom portions to be secured together about the first and second lead elements 107 and 108, such as with pegs extending from the bottom portion through the one or more indentations and/or vacant areas of the lead elements to mate with bores or slots in the top portion. Other steps can additionally and/or alternatively be employed in manufacturing surface mount devices according to some embodiments.

While the invention herein disclosed has been described by means of specific embodiments and applications thereof, numerous modifications and variations could be made thereto by those skilled in the art without departing from the scope of the invention set forth in the claims.

We claim:

1. A surface mount device comprising:
   a casing having a recess formed extending at least partially into said casing; and
   first and second leads each of which is at least partially encased by said casing and each of which has a portion exposed through said recess, wherein at least one of said first and second leads has one or more size reduction features in its said exposed portion that reduces the surface area to provide an increased surface bonding area to said casing around said lead;
   wherein one of said exposed lead portions comprises a chipset carrier element comprising at least two of said size reduction features such that at least a portion of said chipset carrier element comprises first and second indentations opposite and parallel one another such that the width of said chipset portion narrows between said first and second indentations;
   wherein said chipset portion adjoins a termination end;
   wherein said termination end is wider than the area between said first and second indentations.

2. The device of claim 1, wherein said one or more size reduction features comprises one or more indentations.

3. The device of claim 2, wherein said one or more indentations are substantially trapezoidal shaped.

4. The device of claim 1, further comprising one or more electronic and/or optoelectronic devices coupled to at least one of the leads at said portion exposed through said recess.

5. The device of claim 1, wherein said first and second leads have a portion extending through the exterior of said casing.

6. The device of claim 5, wherein the first and second leads have increased thicknesses in the portions extending from said casing.

7. The device of claim 5, wherein at least one of said first and second leads extends through at least one side surface of said casing, and at least one of another of first and second leads extends through at least another side surface of said casing.

8. The device of claim 1, further comprising a fill material within said recess and extending through and bonding to said bonding area around said leads.

9. The device of claim 1, wherein said first and second leads comprise vacant areas to further increase the casing bonding area around said leads.

10. The device of claim 9, wherein at least some of said vacant areas comprise through holes.

11. The device of claim 9, wherein at least some of said vacant areas comprise circular through holes.

12. The device of claim 1, wherein said first and second leads comprise at least one stepped portion.

13. A surface mount device comprising:
    a casing comprising a first surface having a recess extending into the casing; and
    first and second leads at least partially encased by said casing, said first lead having a chipset portion at least partially exposed through said recess, said second lead proximate said first lead, said second lead having a head portion exposed through said recess, wherein said chipset portion has first and second indentations opposite and parallel each other and said first indentation including a first depth and said second indentation including a second depth, wherein said first depth is different from said second depth, such that the width of said chipset portion narrows between said first and second indentations, wherein said chipset portion extends into a termination end encased by said casing;
    wherein the termination end extends beyond a perimeter of the recess.

14. The device of claim 13, wherein said first and second leads extend through a second surface of the casing, and wherein said first and second leads have increased thicknesses exterior to the casing.

15. The device of claim 13, wherein said first and second indentations are defined along a length of said chipset portion, with first portions of said first and second indentations being encased by said casing and second portions of said first and second indentations extending into the area exposed by said recess.

16. The device of claim 15, wherein said first and second indentations are on opposite sides of said chipset portion and extend along the length of said chipset portion.

17. The device of claim 13, further comprising fill material within at least a portion of said recess, wherein casing material extends through first portions of said first and second indentations and said fill material extends through second portions of said first and second indentations.

18. The device of claim 13, wherein said first and second leads comprise vacant areas to further increase the casing bonding area around said leads.

19. The device of claim 18, wherein at least some of said vacant areas comprise circular through holes.

20. The device of claim 13, wherein said first and second leads comprise at least one stepped portion.

21. The device of claim 13, wherein the second indentation is proximate the second lead element.

22. The device of claim 13, wherein the second indentation is generally parallel to an edge of the second lead element.

23. The device of claim 13, wherein the second depth of the second indentation comprises a dimension of an area.

24. The device of claim 13, wherein portions of the first and second indentations are filled in by the casing.

25. A method of manufacturing a surface mount device, comprising:
providing a first lead element comprising a chipset portion, said chipset portion comprising a first indentation and a second indentation parallel and opposite each other and said first indentation including a first depth and said second indentation including a second depth such that the width of said chipset portion narrows between said first and second indentation, wherein said chipset portion extends into a termination end encased by said casing;
providing a second lead element comprising a head portion;
encasing a portion of the first and second lead elements in a casing, the first and second lead elements positioned apart, the area between the first and second elements defining an insulation gap, the second indentation partially defines the insulation gap, and the chipset portion and the head portion terminating interior to the casing; and
forming a recess in a first surface of the casing and exposing a section of the chipset portion, a section of the head portion, and a portion of the first and second indentations through the recess, such that said exposed portion of said first lead is narrower than surrounding exposed portions of said first lead;
wherein the termination end extends beyond a perimeter of the recess.

26. The method of claim 25, further comprising:
extending the first and second lead elements through a second surface of the casing; and
bending the first and second lead elements along the second surface.

27. The method of claim 26, wherein providing the first and second lead elements comprises shaping the first and second lead elements such that the portion of the first and second lead elements bent along the second surface has a thickness greater than a thickness of the first and second lead elements encased by the casing.

28. The method of claim 25, wherein providing the first lead element comprises shaping the chipset portion of the first lead element such that the chipset portion extends through the area exposed by the recess, and shaping the first and second indentations on opposite sides of said chipset portion; and
wherein the encasing comprises encasing a second portion of the first indentation with the casing such that casing material extends through at least a portion of the second portion of the first indentation, and encasing a second portion of the second indentation with the casing such that casing material extends through at least a portion of the second portion of the second indentation.

29. The method of claim 25, wherein the second indentation is proximate the second lead element.

30. The method of claim 25, wherein the second indentation is generally parallel to an edge of the second lead element.

31. The method of claim 25, wherein the second depth of the second indentation comprises a dimension of an area.

32. The method of claim 25, wherein portions of the first and second indentations are filled in by the casing.

* * * * *